United States Patent
Then et al.

(10) Patent No.: US 12,381,039 B2
(45) Date of Patent: Aug. 5, 2025

(54) HIGH VOLTAGE METAL INSULATOR METAL (MIM) CAPACITOR

(71) Applicant: Intel Corporation, Santa Clara, CA (US)

(72) Inventors: Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 840 days.

(21) Appl. No.: 17/403,041

(22) Filed: Aug. 16, 2021

(65) Prior Publication Data

US 2023/0050491 A1    Feb. 16, 2023

(51) Int. Cl.
*H01G 4/30* (2006.01)
*H01G 4/06* (2006.01)
*H10D 1/68* (2025.01)
*H10D 48/36* (2025.01)

(52) U.S. Cl.
CPC .......... *H01G 4/30* (2013.01); *H01G 4/06* (2013.01); *H10D 1/692* (2025.01); *H10D 48/36* (2025.01)

(58) Field of Classification Search
CPC ... H01G 4/30; H01G 4/06; H01G 4/33; H01L 28/60; H01L 29/76; H01L 28/40; H01L 28/75; H01L 23/5223; H01L 28/56; H01L 23/522; G06F 1/16
See application file for complete search history.

(56) References Cited

U.S. PATENT DOCUMENTS

| | | | |
|---|---|---|---|
| 2001/0003664 A1* | 6/2001 | Yamaguchi | H01L 21/02263 257/E21.01 |
| 2007/0065966 A1 | 3/2007 | Chinthakindi | |

(Continued)

FOREIGN PATENT DOCUMENTS

WO    WO 2013/048522    4/2013

OTHER PUBLICATIONS

Notice of Allowance from European Patent Application No. 22184070.5, mailed Apr. 11, 2024, 54 pgs.

(Continued)

*Primary Examiner* — Timothy J. Dole
*Assistant Examiner* — Daniel M Dubuisson
(74) *Attorney, Agent, or Firm* — Schwabe, Williamson & Wyatt, P.C.

(57) ABSTRACT

High voltage metal insulator metal capacitors are described. In an example, a capacitor includes a first electrode plate, and a first capacitor dielectric on the first electrode plate. A second electrode plate is on the first capacitor dielectric and is over and parallel with the first electrode plate, and a second capacitor dielectric is on the second electrode plate. A third electrode plate is on the second capacitor dielectric and is over and parallel with the second electrode plate, and a third capacitor dielectric is on the third electrode plate. A fourth electrode plate is on the third capacitor dielectric and is over and parallel with the third electrode plate. In another example, a capacitor includes a first electrode, a capacitor dielectric on the first electrode, and a second electrode on the capacitor dielectric. The capacitor dielectric includes a plurality of alternating first dielectric layers and second dielectric layers.

10 Claims, 9 Drawing Sheets

(56) References Cited

U.S. PATENT DOCUMENTS

2010/0309606 A1    12/2010  Allers
2017/0062330 A1*   3/2017  Kim ................... H01L 23/5226

OTHER PUBLICATIONS

Notice of Allowance from European Patent Application No. 22184070.5, mailed Dec. 14, 2023, 7 pgs.
Search Report from International Patent Application No. 22184070.5, mailed Mar. 3, 2023, 5 pgs.

* cited by examiner

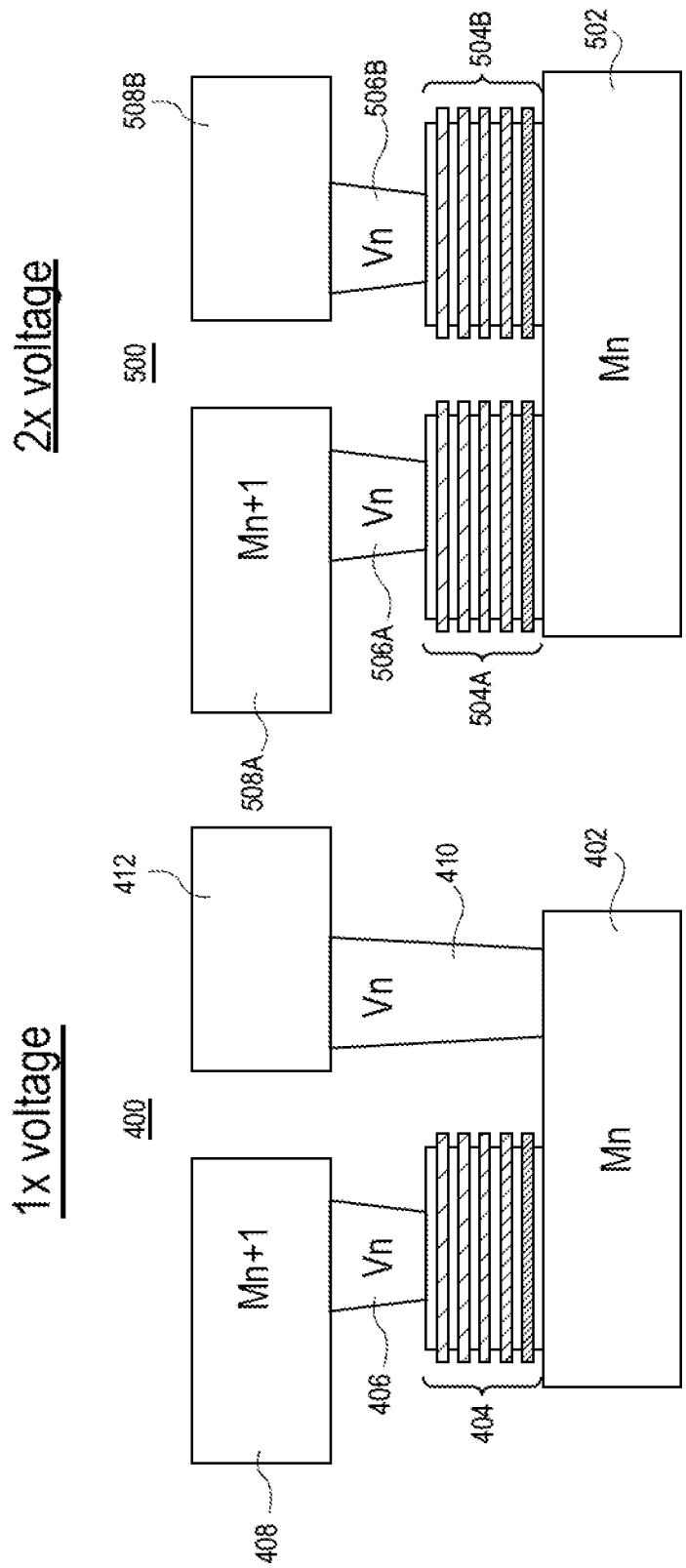

HIGH VOLTAGE METAL INSULATOR METAL (MIM) CAPACITOR

TECHNICAL FIELD

Embodiments of the disclosure are in the field of advanced integrated circuit structure fabrication and, in particular, metal insulator metal (MIM) capacitors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into smaller and smaller nodes. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 4 illustrates a cross-sectional view of an integrated circuit structure including a single MIM stack, in accordance with an embodiment of the present disclosure.

FIG. 5 illustrates a cross-sectional view of an integrated circuit structure including two MIM stacks, in accordance with an embodiment of the present disclosure.

DESCRIPTION OF THE EMBODIMENTS

Figure 1:
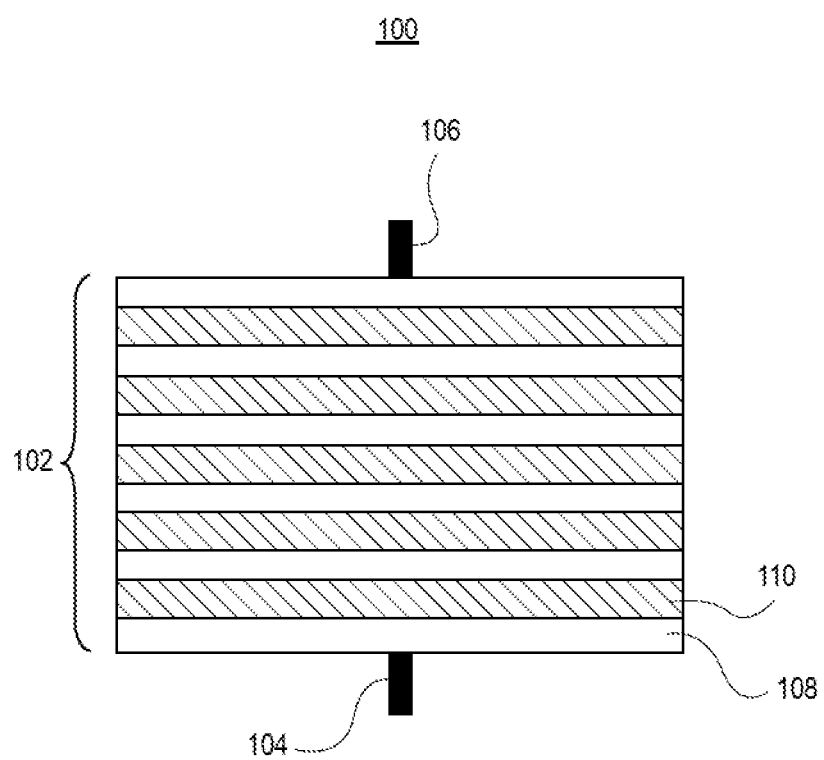
FIG. 1 illustrates a cross-sectional view of a MIM capacitor, in accordance with an embodiment of the present disclosure.

Metal insulator metal (MIM) capacitors are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, metal insulator metal (MIM) capacitors are described. One or more embodiments are directed to high voltage reliable capacitor devices for direct battery attach (2S-3S) 6V to 12V Power Delivery. For switching buck converters, it is quite common that the voltage across such MIM capacitors could rise to 12V to 24V due to transients. Embodiments can be implemented to increase capacitance of a MIM capacitor while meeting reliability specifications.

To provide context, it is an industry challenge to design and fabricate high voltage reliable metal-insulator-metal (MIM) capacitor devices for direct battery attach that can handle 12V to 24V for power delivery applications. Well known high voltage capacitors used on die are typically SiN-based, and have a low capacitance density (F per unit area), requiring substantial die area. High density MIMs found in leading node technologies are all of very low-voltage ratings, e.g., less than 2V, and can be unreliable for high voltages. Large die area typically used for high voltage capacitors enlarges die size and increases cost.

In accordance with one or more embodiments of the present disclosure, 3D-stacking of a M-I-M-I-M- . . . (metal-insulator-metal-insulator-metal- . . . ) structure is used to increase the capability of an entire stack to handle higher voltages. Embodiments can be implemented to enable the fabrication of products with functionalities (e.g., as enabled by GaN and Si integration) and performance that cannot otherwise not be achieved. For example, power delivery and RF communication are essential to every compute solution. Si and group III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities. Monolithic 3D integration is a powerful way to integrate dissimilar best-in-class semiconductor technologies on the same silicon to deliver the best performance, improved density, and more functionalities.

As an exemplary capacitor structure, FIG. 1 illustrates a cross-sectional view of a MIM capacitor, in accordance with an embodiment of the present disclosure.

Referring to FIG. 1, an integrated circuit structure 100 includes a MIM stack 102 coupled to a lower electrode 104 and an upper electrode 106. The MIM stacks 102 includes a plurality of alternating conductive layers 108 (e.g., layers of titanium nitride, TiN, which can be referred to as electrode plates) and high-k dielectric layers 110 (e.g., metal oxide layers or other dielectric layers having a dielectric constant above 7 or above that of silicon nitride; note that embodiments can include two or more dielectric layers, with five layers shown.) In a particular embodiment, the high-k dielectric layers have a dielectric constant of about 20, a reliability of 1V at 5 years, a capacitance density (Cdensity) for a single layer of about 70 fF/micron$^2$, a Cdensity of 5-stack of 14 fF/micron$^2$, and close to 5V at 5 years.

With reference again to FIG. 1, there can be challenges associated with preventing metal shorting on the sidewalls of the MIM stack 102. That is, etching a M-I-M-I-M- . . . stack presents a new challenge. As the stack is etched, residual metallic elements, e.g., Ti, can redeposit on the sidewall of the stack causing potential parasitic electrical shorting path across the dielectric layer.

Figure 2:
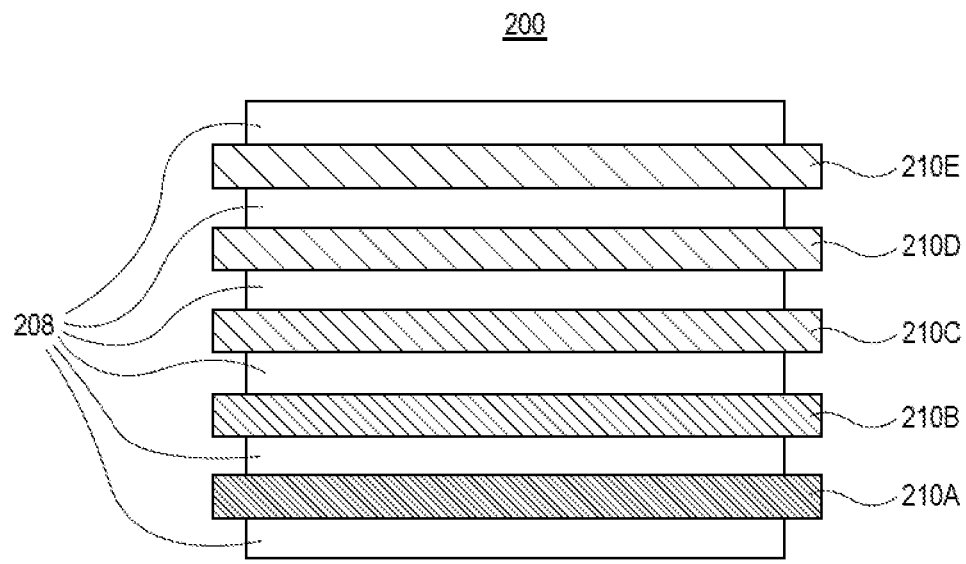
FIG. 2 illustrates a cross-sectional view of a MIM capacitor stack having recessed electrode or plate layers, in accordance with an embodiment of the present disclosure.

As a first example addressing the above issues, FIG. 2 illustrates a cross-sectional view of a MIM capacitor stack having recessed electrode or plate layers, in accordance with an embodiment of the present disclosure.

Referring to FIG. 2, a MIM stack 200 includes a plurality of alternating conductive layers 208 (e.g., layers of titanium nitride, TiN, which can be referred to as electrode plates) and high-k dielectric layers 210A, 210B, 210C, 210D, 210E, etc. (e.g., metal oxide layers or other dielectric layers having a dielectric constant above 7 or above that of silicon nitride; note that embodiments can include two or more dielectric layers, with five layers shown.) In one embodiment, the dielectric constant of the high-k dielectric layers decreases from bottom to top (in other embodiments, however, the dielectric constant of the high-k dielectric layers increases from bottom to top). In a particular embodiment, the high-k dielectric layer 210E has a dielectric constant of about 20 and a reliability of about 1V, and the high-k dielectric layer 210A has a dielectric constant of about 20 and a reliability of less than 1V. In an embodiment, a wet etch is performed to recess the conductive layers 208 to prevent shorting. In one embodiment, the gradation in dielectric constant of the high-k dielectric layers 210A, 210B, 210C, 210D, 210E, etc. is achieved by a selected deposition sequence. A capacitor divider can dictate smaller voltages across higher dielectric constant layers, e.g., and can be self-adjusting.

With reference again to FIG. 2, in accordance with an embodiment of the present disclosure, a metal-insulator-metal (MIM) capacitor includes a first electrode plate (bottommost 208), and a first capacitor dielectric 210A on the first electrode plate, the first capacitor dielectric 210A including a first high-k material having a first dielectric constant. A second electrode plate (second bottommost 208) is on the first capacitor dielectric 210A and has a portion over and parallel with the first electrode plate, and a second capacitor dielectric 210B is on the second electrode plate, the second capacitor dielectric 210B including a second high-k material having a second dielectric constant less than the first dielectric constant. A third electrode plate (third bottommost 208) is on the second capacitor dielectric 210B and has a portion over and parallel with the second electrode plate, and a third capacitor dielectric 210C is on the third electrode plate, the third capacitor dielectric 210C including a third high-k material having a third dielectric constant less than the second dielectric constant. A fourth electrode plate (fourth bottommost 208) is on the third capacitor dielectric 210C and has a portion over and parallel with the third electrode plate.

In an embodiment, a fourth capacitor dielectric 210D is on the fourth electrode plate, the fourth capacitor dielectric 210D including a fourth high-k material having a fourth dielectric constant less than the third dielectric constant, and a fifth electrode plate (fifth bottommost 208) is on the fourth capacitor dielectric 210D, the fifth electrode plate having a portion over and parallel with the fourth electrode plate, as is depicted. In one such embodiment, a fifth capacitor dielectric 210E is on the fifth electrode plate, the fifth capacitor dielectric 210E including a fifth high-k material having a fifth dielectric constant less than the fourth dielectric constant, and a sixth electrode plate (sixth bottommost 208) is on the fifth capacitor dielectric 210E, the sixth electrode plate having a portion over and parallel with the fifth electrode plate, as is depicted. In an embodiment, the capacitor dielectrics 210 extend laterally beyond the electrode plates 208, as is depicted.

In an embodiment, the electrode plates 208 (i.e., the MIM stack 200) is included in a single dielectric layer. In one such embodiment, the single dielectric layer is included in a back-end-of-line (BEOL) metallization structure, the BEOL metallization structure above a plurality of integrated circuit devices, examples of which are described in greater detail below.

Figure 3:
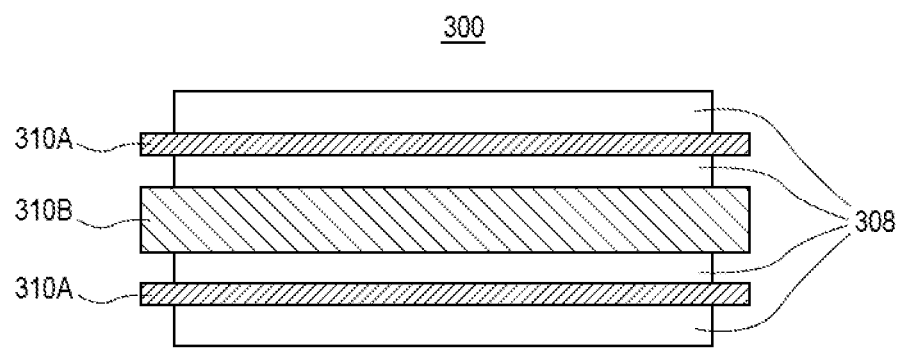
FIG. 3 illustrates a cross-sectional view of another MIM capacitor stack having recessed electrode or plate layers, in accordance with an embodiment of the present disclosure.

As a second example addressing the above issues, FIG. 3 illustrates a cross-sectional view of another MIM capacitor stack having recessed electrode or plate layers, in accordance with an embodiment of the present disclosure.

Referring to FIG. 3, a MIM stack 300 includes a plurality of alternating conductive layers 308 (e.g., layers of titanium nitride, TiN, which can be referred to as electrode plates) and dielectric layers 310A/310B. The outer dielectric layers 310A are high-k layers (e.g., metal oxide layers or other dielectric layers having a dielectric constant above 7 or above that of silicon nitride.) The inner dielectric layer 310B has a dielectric constant lower than a dielectric constant of the outer dielectric layers 310A, and can have a thickness greater than a thickness of individual ones of the outer dielectric layers 310A. In one embodiment, the inner dielectric layer 310B is or includes silicon nitride and has a dielectric constant of about 7. In a particular embodiment, the high-k dielectric layers 310A have a dielectric constant of about 20 and a reliability of about 1V, and the inner dielectric layer 310B has a dielectric constant of about 7 and a reliability of about 13V. In an embodiment, a wet etch is performed to recess the conductive layers 308 to prevent shorting. A capacitor divider can dictate smaller voltages across higher dielectric constant layers, e.g., and can be self-adjusting.

With reference again to FIG. 3, in accordance with an embodiment of the present disclosure, a metal-insulator-metal (MIM) capacitor includes a first electrode plate (bottommost 308), and a first capacitor dielectric (lower 310A) on the first electrode plate, the first capacitor dielectric including a first high-k material having a first dielectric constant. A second electrode plate (second bottommost 308) is on the first capacitor dielectric 310A and has a portion over and parallel with the first electrode plate, and a second capacitor dielectric 310B is on the second electrode plate, the second capacitor dielectric 310B including a material having a second dielectric constant less than the first dielectric constant. A third electrode plate (third bottommost 308) is on the second capacitor dielectric 310B and has a portion over and parallel with the second electrode plate, and a third capacitor dielectric (upper 310A) is on the third electrode plate, the third capacitor dielectric including a second high-k material having a second dielectric constant greater than the second dielectric constant. A fourth electrode plate (fourth bottommost 308) is on the third capacitor dielectric and has a portion over and parallel with the third electrode plate.

In an embodiment, the capacitor dielectrics 310A/310B extend laterally beyond the electrode plates 308, as is depicted. In an embodiment, the electrode plates 308 (i.e., the MIM stack 300) is included in a single dielectric layer. In one such embodiment, the single dielectric layer is included in a back-end-of-line (BEOL) metallization structure, the BEOL metallization structure above a plurality of integrated circuit devices, examples of which are described in greater detail below.

As an example of a BEOL structure including a MIM capacitor, FIG. 4 illustrates a cross-sectional view of an integrated circuit structure including a single MIM stack, in accordance with an embodiment of the present disclosure.

Referring to FIG. 4, a 1× voltage integrated circuit structure 400 includes a lower metallization line 402, Mn. A MIM stack 404 is on the lower metallization line 402, Mn. The MIM stack 404 may be a MIM stack such as MIM stack 102, MIM stack 200 or MIM stack 300, described above. A first upper metallization line 408, Mn+1, is coupled to the MIM stack 404 by a via 406, Vn. A second upper metallization line 412, Mn+1, is coupled to the lower metallization line 402, Mn, by a via 410, Vn.

As an example of a BEOL structure including two MIM capacitors, FIG. 5 illustrates a cross-sectional view of an integrated circuit structure including two MIM stacks, in accordance with an embodiment of the present disclosure.

Referring to FIG. 5, a 2× voltage integrated circuit structure 500 includes a lower metallization line 502, Mn. A first MIM stack 504A and a second MIM stack 504B are on the lower metallization line 502, Mn. The MIM stacks 504A and 504B may each be a MIM stack such as MIM stack 102, MIM stack 200 or MIM stack 300, described above. A first upper metallization line 508A, Mn+1, is coupled to the MIM stack 504A by a first via 506A, Vn. A second upper metallization line 508B, Mn+1, is coupled to the MIM stack 504B by a first via 506B, Vn.

Figure 6:
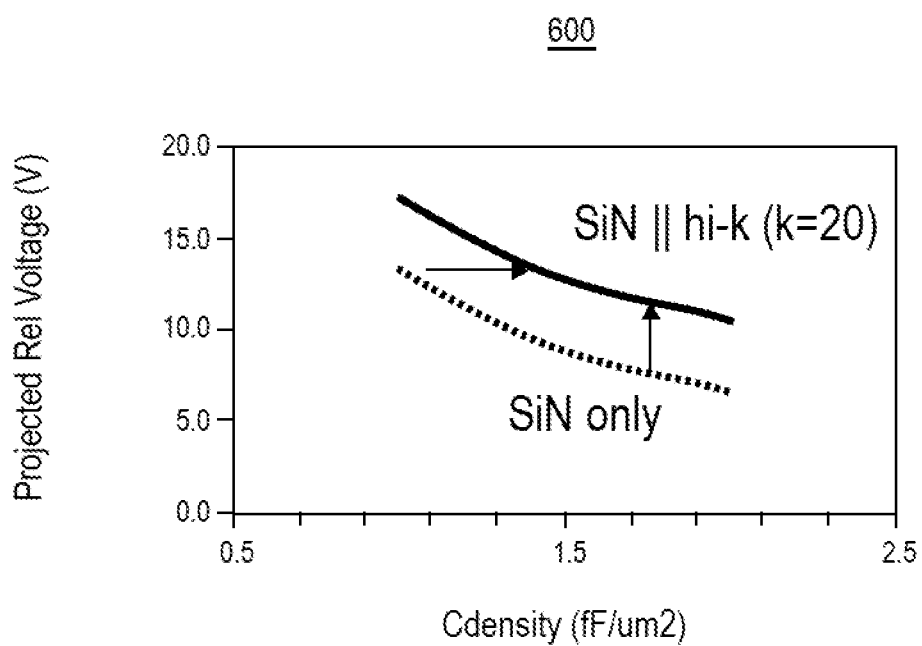
FIG. 6 is a plot 600 of projected reliability voltage (V) as a function of Cdensity (fF/micron$^2$), in accordance with an embodiment of the present disclosure.

With reference again to the MIM stack 300 of FIG. 3, FIG. 6 is a plot 600 of projected reliability voltage (V) as a function of Cdensity (fF/micron$^2$), in accordance with an embodiment of the present disclosure. Referring to plot 600 of FIG. 6, improved reliability is projected for a capacitor structure having both a silicon nitride layer (e.g., layer 310B) and high-k dielectric layers (e.g., layers 310A), versus only one or more silicon nitride layers.

In an embodiment, the high-k dielectric layers described above are composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. With reference specifically to FIGS. 2 and 3, in an embodiment, different high-k dielectric layers are high-k dielectric layers selected from the list above but having a composition different from one another based on varying dielectric constant. In an embodiment, conductive electrodes or plates described above are composed of a metal layer such as, but not limited to, metal nitrides (TiN or TaN), metal carbides, metal silicides, metal aluminides, hafnium, zirconium, titanium, tantalum, aluminum, ruthenium, palladium, platinum, cobalt, nickel, copper, or conductive metal oxides.

One or more embodiments are directed to the use of a scalable and configurable parallel plate capacitor layering scheme in order to provide industry leading MIM capacitive densities, without compromising the reliability of the final device. Such a scaling method can be used to increase cap density without an area impact and can enhance existing designed layouts without extra design overhead. Increasing MIM capacitance provides a significant performance improvement. Advanced transistor scaling requires an advanced and stable power delivery approaches.

In another aspect, back-end-of-line (BEOL) layers of integrated circuits commonly include electrically conductive microelectronic structures, which are known in the art as vias, to electrically connect metal lines or other interconnects above the vias to metal lines or other interconnects below the vias. In accordance with one or more embodiments of the present disclosure, a metal insulator metal (MIM) capacitor such as described above can be included a BEOL structure of an integrated circuit.

Figure 7:
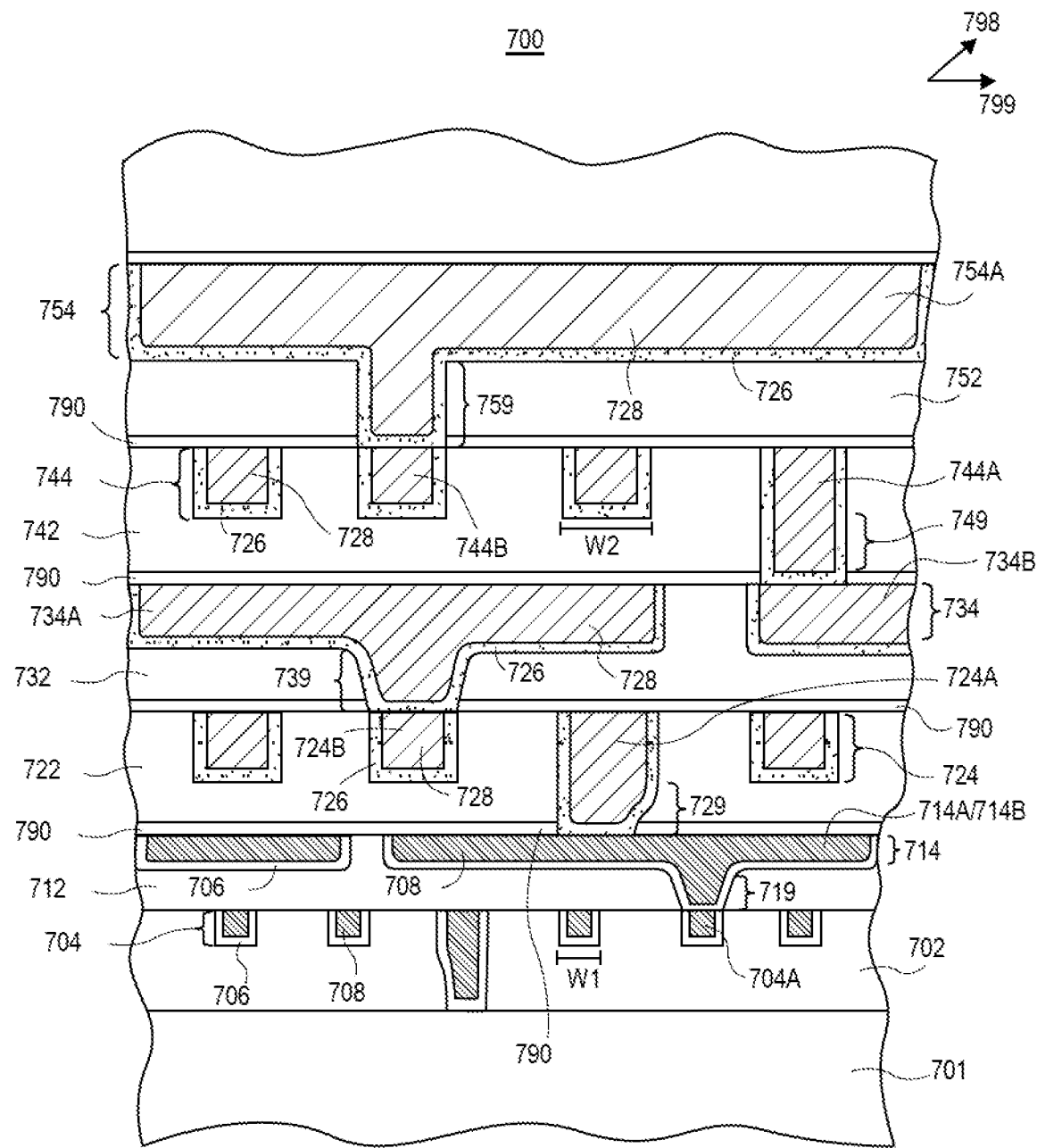
FIG. 7 illustrates a cross-sectional view of an integrated circuit structure having four metallization layers with a metal line composition and pitch above two metallization layers with a differing metal line composition and smaller pitch, in accordance with an embodiment of the present disclosure.

As an exemplary but non-limiting BEOL structure, FIG. 7 illustrates a cross-sectional view of an integrated circuit structure having four metallization layers with a metal line composition and pitch above two metallization layers with a differing metal line composition and smaller pitch, in accordance with an embodiment of the present disclosure. It is to be appreciated that a metal insulator metal (MIM) capacitor according to embodiments described above may be integrated into one or more layers of the integrated circuit structure described below in association with FIG. 7.

Referring to FIG. 7, an integrated circuit structure 700 includes a first plurality of conductive interconnect lines 704 in and spaced apart by a first inter-layer dielectric (ILD) layer 702 above a substrate 701. Individual ones of the first plurality of conductive interconnect lines 704 include a first conductive barrier material 706 along sidewalls and a bottom of a first conductive fill material 708. Individual ones of the first plurality of conductive interconnect lines 704 are along a first direction 798 (e.g., into and out of the page).

A second plurality of conductive interconnect lines 714 is in and spaced apart by a second ILD layer 712 above the first ILD layer 702. Individual ones of the second plurality of conductive interconnect lines 714 include the first conductive barrier material 706 along sidewalls and a bottom of the first conductive fill material 708. Individual ones of the second plurality of conductive interconnect lines 714 are along a second direction 799 orthogonal to the first direction 798.

A third plurality of conductive interconnect lines 724 is in and spaced apart by a third ILD layer 722 above the second ILD layer 712. Individual ones of the third plurality of conductive interconnect lines 724 include a second conductive barrier material 726 along sidewalls and a bottom of a second conductive fill material 728. The second conductive fill material 728 is different in composition from the first conductive fill material 708. Individual ones of the third plurality of conductive interconnect lines 724 are along the first direction 798.

A fourth plurality of conductive interconnect lines 734 is in and spaced apart by a fourth ILD layer 732 above the third ILD layer 722. Individual ones of the fourth plurality of conductive interconnect lines 734 include the second conductive barrier material 726 along sidewalls and a bottom of the second conductive fill material 728. Individual ones of the fourth plurality of conductive interconnect lines 734 are along the second direction 799.

A fifth plurality of conductive interconnect lines 744 is in and spaced apart by a fifth ILD layer 742 above the fourth ILD layer 732. Individual ones of the fifth plurality of conductive interconnect lines 744 include the second conductive barrier material 726 along sidewalls and a bottom of the second conductive fill material 728. Individual ones of the fifth plurality of conductive interconnect lines 744 are along the first direction 798.

A sixth plurality of conductive interconnect lines 754 is in and spaced apart by a sixth ILD layer 752 above the fifth ILD layer 742. Individual ones of the sixth plurality of conductive interconnect lines 754 include the second conductive barrier material 726 along sidewalls and a bottom of the second conductive fill material 728. Individual ones of the sixth plurality of conductive interconnect lines 754 are along the second direction 799.

In an embodiment, the second conductive fill material 728 consists essentially of copper, and the first conductive fill material 708 consists essentially of cobalt. In an embodiment, the first conductive fill material 708 includes copper having a first concentration of a dopant impurity atom, and the second conductive fill material 728 includes copper having a second concentration of the dopant impurity atom, the second concentration of the dopant impurity atom less than the first concentration of the dopant impurity atom.

In an embodiment, the first conductive barrier material 706 is different in composition from the second conductive barrier material 726. In another embodiment, the first conductive barrier material 706 and the second conductive barrier material 726 have the same composition.

In an embodiment, a first conductive via 719 is on and electrically coupled to an individual one 704A of the first plurality of conductive interconnect lines 704. An individual one 714A of the second plurality of conductive interconnect lines 714 is on and electrically coupled to the first conductive via 719.

A second conductive via 729 is on and electrically coupled to an individual one 714B of the second plurality of conductive interconnect lines 714. An individual one 724A of the third plurality of conductive interconnect lines 724 is on and electrically coupled to the second conductive via 729.

A third conductive via 739 is on and electrically coupled to an individual one 724B of the third plurality of conductive interconnect lines 724. An individual one 734A of the fourth plurality of conductive interconnect lines 734 is on and electrically coupled to the third conductive via 739.

A fourth conductive via 749 is on and electrically coupled to an individual one 734B of the fourth plurality of conductive interconnect lines 734. An individual one 744A of the fifth plurality of conductive interconnect lines 744 is on and electrically coupled to the fourth conductive via 749.

A fifth conductive via 759 is on and electrically coupled to an individual one 744B of the fifth plurality of conductive interconnect lines 744. An individual one 754A of the sixth plurality of conductive interconnect lines 754 is on and electrically coupled to the fifth conductive via 759.

In one embodiment, the first conductive via 719 includes the first conductive barrier material 706 along sidewalls and a bottom of the first conductive fill material 708. The second 729, third 739, fourth 749 and fifth 759 conductive vias include the second conductive barrier material 726 along sidewalls and a bottom of the second conductive fill material 728.

In an embodiment, the first 702, second 712, third 722, fourth 732, fifth 742 and sixth 752 ILD layers are separated from one another by a corresponding etch-stop layer 790 between adjacent ILD layers. In an embodiment, the first 702, second 712, third 722, fourth 732, fifth 742 and sixth 752 ILD layers include silicon, carbon and oxygen.

In an embodiment, individual ones of the first 704 and second 714 pluralities of conductive interconnect lines have a first width (W1). Individual ones of the third 724, fourth 734, fifth 744 and sixth 754 pluralities of conductive interconnect lines have a second width (W2) greater than the first width (W1).

It is to be appreciated that the layers and materials described above in association with back-end-of-line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
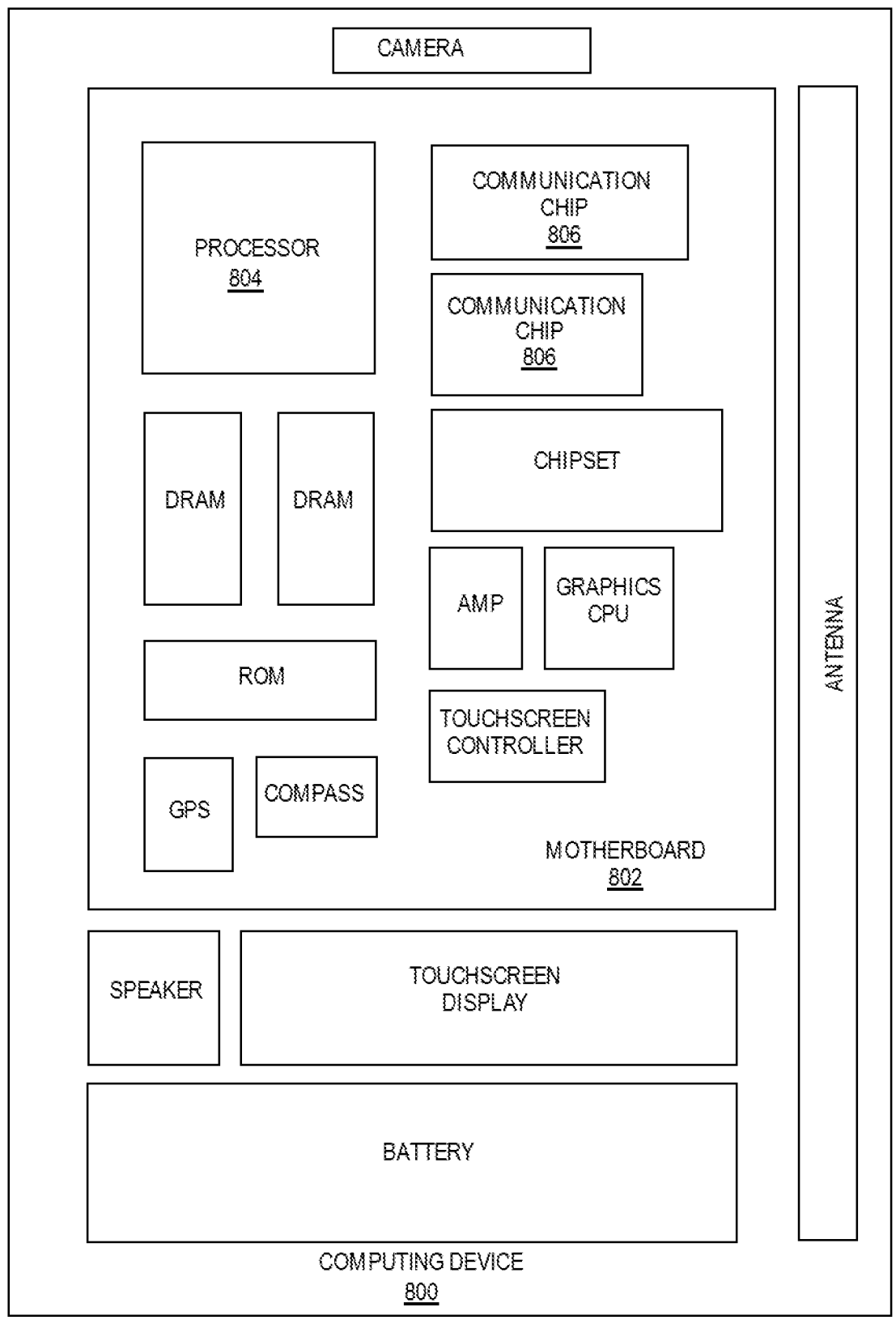
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804.

In some implementations of embodiments of the disclosure, the integrated circuit die of the processor includes one or more structures, such as a metal insulator metal (MIM) capacitor built in accordance with implementations of the disclosure. The term "processor" may refer to any device or portion of a device that processes electronic data from registers or memory to transform that electronic data, or both, into other electronic data that may be stored in registers or memory, or both.

The communication chip 806 also includes an integrated circuit die packaged within the communication chip 806. In accordance with another implementation of the disclosure, the integrated circuit die of the communication chip has a metal insulator metal (MIM) capacitor built in accordance with implementations of the disclosure.

In further implementations, another component housed within the computing device 800 may contain an integrated circuit die having a metal insulator metal (MIM) capacitor built in accordance with implementations of embodiments of the disclosure.

In various embodiments, the computing device 800 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
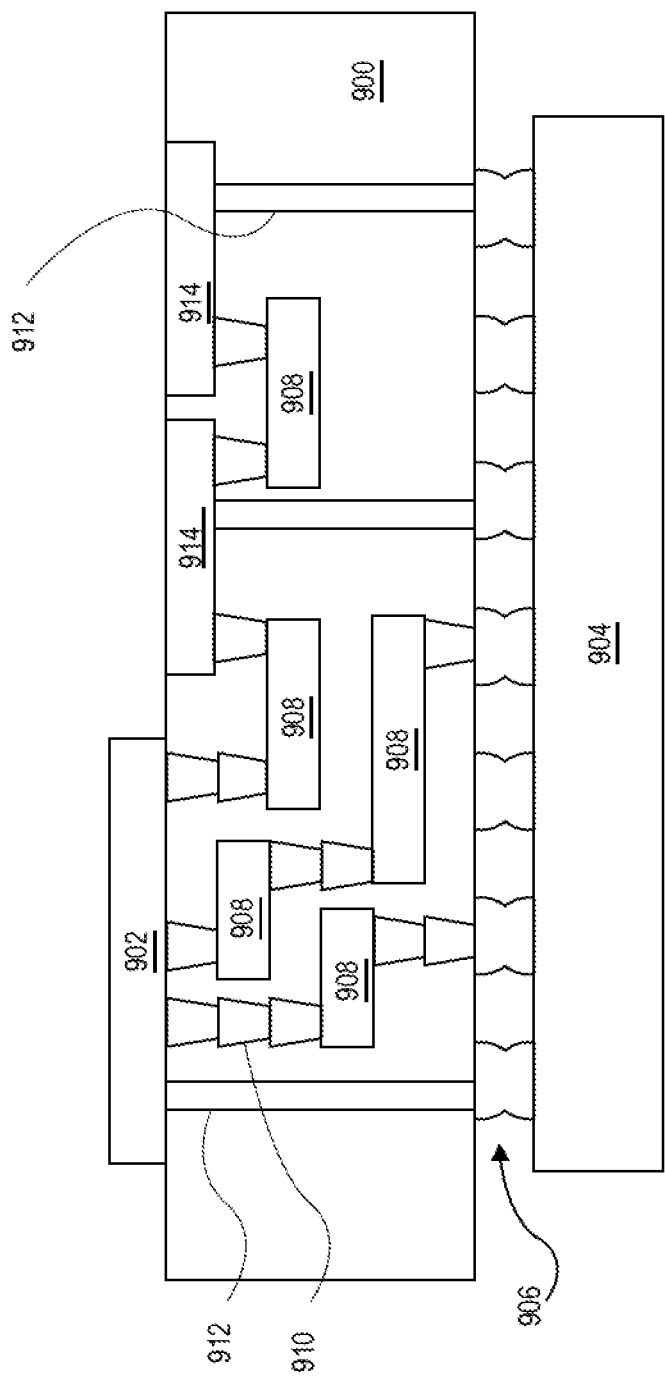
FIG. 9 illustrates an interposer that includes one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And, in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 or in the fabrication of components included in the interposer 900.

Figure 10:
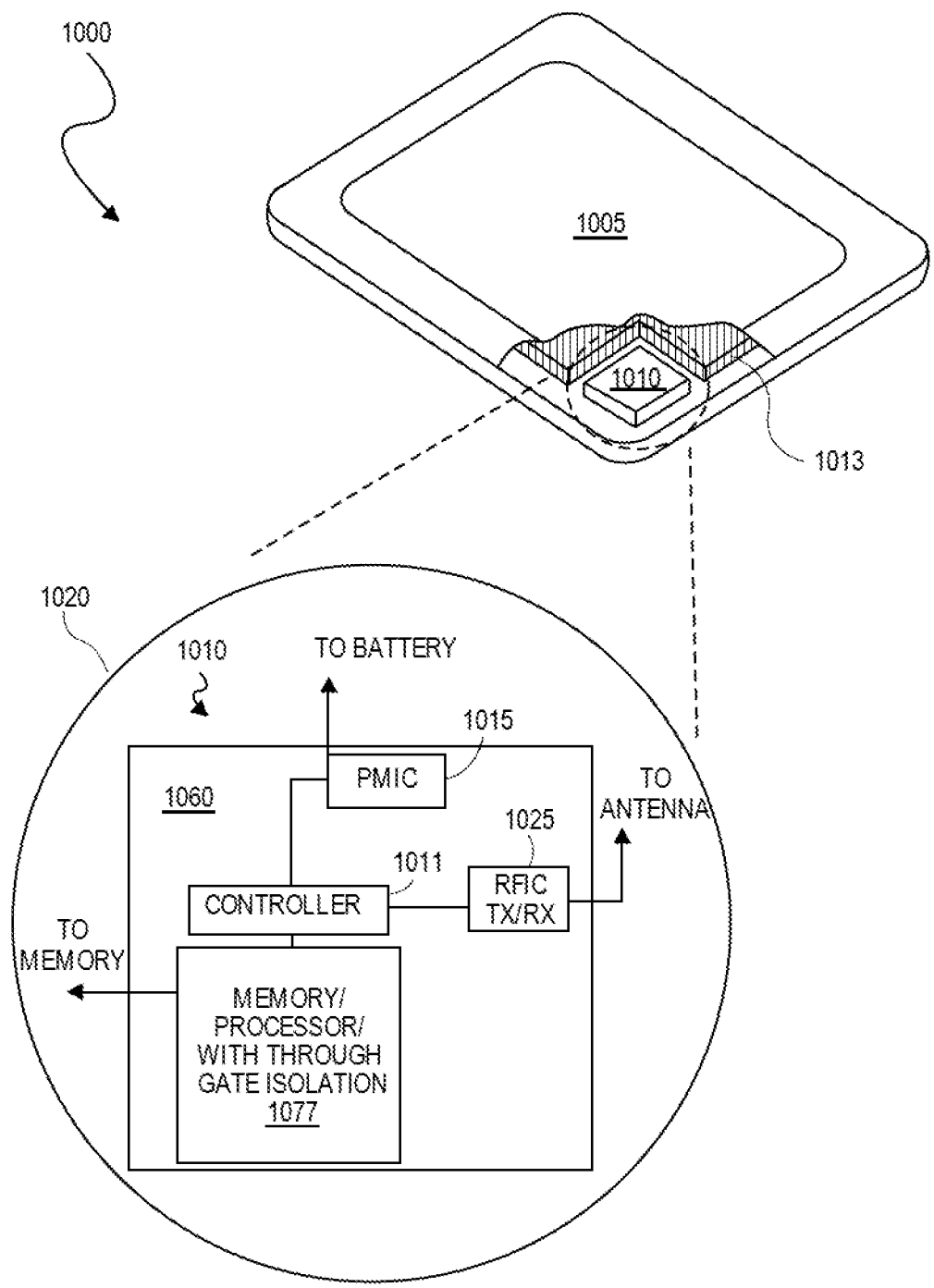
FIG. 10 is an isometric view of a mobile computing platform employing an IC fabricated according to one or more processes described herein or including one or more features described herein, in accordance with an embodiment of the present disclosure.

FIG. 10 is an isometric view of a mobile computing platform 1000 employing an integrated circuit (IC) fabricated according to one or more processes described herein or including one or more features described herein, in accordance with an embodiment of the present disclosure.

The mobile computing platform 1000 may be any portable device configured for each of electronic data display, electronic data processing, and wireless electronic data transmission. For example, mobile computing platform 1000 may be any of a tablet, a smart phone, laptop computer, etc. and includes a display screen 1005 which in the exemplary embodiment is a touchscreen (capacitive, inductive, resistive, etc.), a chip-level (SoC) or package-level integrated system 1010, and a battery 1013. As illustrated, the greater the level of integration in the system 1010 enabled by higher transistor packing density, the greater the portion of the mobile computing platform 1000 that may be occupied by the battery 1013 or non-volatile storage, such as a solid state drive, or the greater the transistor gate count for improved platform functionality. Similarly, the greater the carrier mobility of each transistor in the system 1010, the greater the functionality. As such, techniques described herein may enable performance and form factor improvements in the mobile computing platform 1000.

The integrated system 1010 is further illustrated in the expanded view 1020. In the exemplary embodiment, packaged device 1077 includes at least one memory chip (e.g., RAM), or at least one processor chip (e.g., a multi-core microprocessor and/or graphics processor) fabricated according to one or more processes described herein or including one or more features described herein. The packaged device 1077 is further coupled to the board 1060 along with one or more of a power management integrated circuit (PMIC) 1015, RF (wireless) integrated circuit (RFIC) 1025 including a wideband RF (wireless) transmitter and/or receiver (e.g., including a digital baseband and an analog front end module further includes a power amplifier on a transmit path and a low noise amplifier on a receive path), and a controller thereof 1011. Functionally, the PMIC 1015 performs battery power regulation, DC-to-DC conversion, etc., and so has an input coupled to the battery 1013 and with an output providing a current supply to all the other functional modules. As further illustrated, in the exemplary embodiment, the RFIC 1025 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1077 or within a single IC (SoC) coupled to the package substrate of the packaged device 1077.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 11:
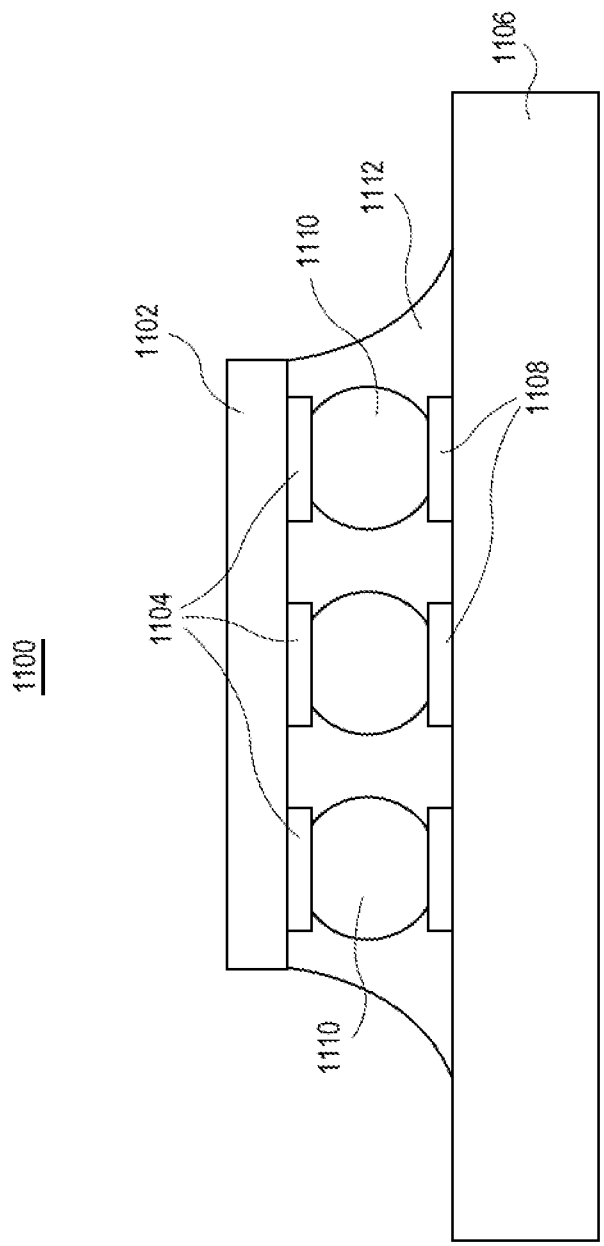
FIG. 11 illustrates a cross-sectional view of a flip-chip mounted die, in accordance with an embodiment of the present disclosure.

FIG. 11 illustrates a cross-sectional view of a flip-chip mounted die, in accordance with an embodiment of the present disclosure.

Referring to FIG. 11, an apparatus 1100 includes a die 1102 such as an integrated circuit (IC) fabricated according to one or more processes described herein or including one or more features described herein, in accordance with an embodiment of the present disclosure. The die 1102 includes metallized pads 1104 thereon. A package substrate 1106, such as a ceramic or organic substrate, includes connections 1108 thereon. The die 1102 and package substrate 1106 are electrically connected by solder balls 1110 coupled to the metallized pads 1104 and the connections 1108. An underfill material 1112 surrounds the solder balls 1110.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include metal insulator metal (MIM) capacitors.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A metal-insulator-metal (MIM) capacitor includes a first electrode plate, and a first capacitor dielectric on the first electrode plate, the first capacitor dielectric including a first high-k material having a first dielectric constant. A second electrode plate is on the first capacitor dielectric and has a portion over and parallel with the first electrode plate, and a second capacitor dielectric is on the second electrode plate, the second capacitor dielectric including a second high-k material having a second dielectric constant less than the first dielectric constant. A third electrode plate is on the second capacitor dielectric and has a portion over and parallel with the second electrode plate, and a third capacitor dielectric is on the third electrode plate, the third capacitor dielectric including a third high-k material having a third dielectric constant less than the second dielectric constant. A fourth electrode plate is on the third capacitor dielectric and has a portion over and parallel with the third electrode plate.

Example embodiment 2: The MIM capacitor of example embodiment 1, further including a fourth capacitor dielectric on the fourth electrode plate, the fourth capacitor dielectric including a fourth high-k material having a fourth dielectric constant less than the third dielectric constant, and a fifth electrode plate on the fourth capacitor dielectric, the fifth electrode plate having a portion over and parallel with the fourth electrode plate.

Example embodiment 3: The MIM capacitor of example embodiment 1 or 2, wherein the first, second and third capacitor dielectrics extend laterally beyond the first, second, third and fourth electrode plates.

Example embodiment 4: The MIM capacitor of example embodiment 1, 2 or 3, wherein the first, second, third and fourth electrode plates are included in a single dielectric layer.

Example embodiment 5: The MIM capacitor of example embodiment 4, wherein the single dielectric layer is included in a back-end-of-line (BEOL) metallization structure, the BEOL metallization structure above a plurality of integrated circuit devices.

Example embodiment 6: A metal-insulator-metal (MIM) capacitor includes a first electrode plate, and a first capacitor dielectric on the first electrode plate, the first capacitor dielectric including a first high-k material having a first dielectric constant. A second electrode plate is on the first capacitor dielectric and has a portion over and parallel with the first electrode plate, and a second capacitor dielectric is on the second electrode plate, the second capacitor dielectric including a material having a second dielectric constant less than the first dielectric constant. A third electrode plate is on the second capacitor dielectric and has a portion over and parallel with the second electrode plate, and a third capacitor dielectric is on the third electrode plate, the third capacitor dielectric including a second high-k material having a second dielectric constant greater than the second dielectric constant. A fourth electrode plate is on the third capacitor dielectric and has a portion over and parallel with the third electrode plate.

Example embodiment 7: The MIM capacitor of example embodiment 6, wherein the material having a second dielectric constant is or includes silicon and nitrogen.

Example embodiment 8: The MIM capacitor of example embodiment 6 or 7, wherein the first, second and third capacitor dielectrics extend laterally beyond the first, second, third and fourth electrode plates.

Example embodiment 9: The MIM capacitor of example embodiment 6, 7 or 8, wherein the first, second, third and fourth electrode plates are included in a single dielectric layer.

Example embodiment 10: The MIM capacitor of example embodiment 9, wherein the single dielectric layer is included in a back-end-of-line (BEOL) metallization structure, the BEOL metallization structure above a plurality of integrated circuit devices.

Example embodiment 11: A computing device includes a board, and a component coupled to the board. The component includes a metal-insulator-metal (MIM) capacitor including a first electrode plate, and a first capacitor dielectric on the first electrode plate, the first capacitor dielectric including a first high-k material having a first dielectric constant. A second electrode plate is on the first capacitor dielectric and has a portion over and parallel with the first electrode plate, and a second capacitor dielectric is on the second electrode plate, the second capacitor dielectric including a second high-k material having a second dielectric constant less than the first dielectric constant. A third electrode plate is on the second capacitor dielectric and has a portion over and parallel with the second electrode plate, and a third capacitor dielectric is on the third electrode plate, the third capacitor dielectric including a third high-k material having a third dielectric constant less than the second dielectric constant. A fourth electrode plate is on the third capacitor dielectric and has a portion over and parallel with the third electrode plate.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes a metal-insulator-metal (MIM) capacitor including a first electrode plate, and a first capacitor dielectric on the first electrode plate, the first capacitor dielectric including a first high-k material having a first dielectric constant. A second electrode plate is on the first capacitor dielectric and has a portion over and parallel with the first electrode plate, and a second capacitor dielectric is on the second electrode plate, the second capacitor dielectric including a material having a second dielectric constant less than the first dielectric constant. A third electrode plate is on the second capacitor dielectric and has a portion over and parallel with the second electrode plate, and a third capacitor dielectric is on the third electrode plate, the third capacitor dielectric including a second high-k material having a second dielectric constant greater than the second dielectric constant. A fourth electrode plate is on the third capacitor dielectric and has a portion over and parallel with the third electrode plate.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. A metal-insulator-metal (MIM) capacitor, comprising:
   a first electrode plate;
   a first capacitor dielectric on the first electrode plate, the first capacitor dielectric comprising a first high-k material having a first dielectric constant;
   a second electrode plate on the first capacitor dielectric, the second electrode plate having a portion over and parallel with the first electrode plate;
   a second capacitor dielectric on the second electrode plate, the second capacitor dielectric comprising a second high-k material having a second dielectric constant less than the first dielectric constant;
   a third electrode plate on the second capacitor dielectric, the third electrode plate having a portion over and parallel with the second electrode plate;
   a third capacitor dielectric on the third electrode plate, the third capacitor dielectric comprising a third high-k material having a third dielectric constant less than the second dielectric constant; and
   a fourth electrode plate on the third capacitor dielectric, the fourth electrode plate having a portion over and parallel with the third electrode plate.

2. The MIM capacitor of claim 1, further comprising:
   a fourth capacitor dielectric on the fourth electrode plate, the fourth capacitor dielectric comprising a fourth high-k material having a fourth dielectric constant less than the third dielectric constant; and
   a fifth electrode plate on the fourth capacitor dielectric, the fifth electrode plate having a portion over and parallel with the fourth electrode plate.

3. The MIM capacitor of claim 1, wherein the first, second and third capacitor dielectrics extend laterally beyond the first, second, third and fourth electrode plates.

4. The MIM capacitor of claim 1, wherein the first, second, third and fourth electrode plates are included in a single dielectric layer.

5. The MIM capacitor of claim 4, wherein the single dielectric layer is included in a back-end-of-line (BEOL) metallization structure, the BEOL metallization structure above a plurality of integrated circuit devices.

6. A computing device, comprising:
   a board; and
      a component coupled to the board, the component including a metal-insulator-metal (MIM) capacitor, comprising:
      a first electrode plate;
      a first capacitor dielectric on the first electrode plate, the first capacitor dielectric comprising a first high-k material having a first dielectric constant;
      a second electrode plate on the first capacitor dielectric, the second electrode plate having a portion over and parallel with the first electrode plate;
      a second capacitor dielectric on the second electrode plate, the second capacitor dielectric comprising a second high-k material having a second dielectric constant less than the first dielectric constant;
      a third electrode plate on the second capacitor dielectric, the third electrode plate having a portion over and parallel with the second electrode plate;
      a third capacitor dielectric on the third electrode plate, the third capacitor dielectric comprising a third high-k material having a third dielectric constant less than the second dielectric constant; and
      a fourth electrode plate on the third capacitor dielectric, the fourth electrode plate having a portion over and parallel with the third electrode plate.

7. The computing device of claim 6, further comprising:
a memory coupled to the board.

8. The computing device of claim 6, further comprising:
a communication chip coupled to the board.

9. The computing device of claim 6, further comprising:
a camera coupled to the board.

10. The computing device of claim 6, wherein the component is a packaged integrated circuit die.

* * * * *